US008397381B2

(12) United States Patent
Tsai

(10) Patent No.: US 8,397,381 B2
(45) Date of Patent: Mar. 19, 2013

(54) METHOD FOR MANUFACTURING LIGHT SET WITH SURFACE MOUNTED LIGHT EMITTING COMPONENTS

(75) Inventor: Kenneth Tsai, Zhonghe (TW)

(73) Assignee: Allied Bright Technology Limited, Road Town, Tortola (VG)

( * ) Notice: Subject to any disclaimer, the term of this patent is extended or adjusted under 35 U.S.C. 154(b) by 895 days.

(21) Appl. No.: 12/461,273

(22) Filed: Aug. 6, 2009

(65) Prior Publication Data

US 2011/0034101 A1 Feb. 10, 2011

(51) Int. Cl.
*H01R 43/00* (2006.01)
*H05K 13/00* (2006.01)

(52) U.S. Cl. ................ 29/854; 29/561; 29/748; 29/855; 362/555; 362/249.02

(58) Field of Classification Search .................... 29/561, 29/748, 854, 855; 362/555, 249.02
See application file for complete search history.

(56) References Cited

U.S. PATENT DOCUMENTS 5,406,693 A * 4/1995 Egashira et al. ................ 29/600
6,837,598 B2 * 1/2005 Marcus .......................... 362/374
2005/0106710 A1 * 5/2005 Friedman et al. .......... 435/287.1
2011/0019433 A1 * 1/2011 Dussault ....................... 362/555

* cited by examiner

*Primary Examiner* — Derris Banks
*Assistant Examiner* — Jeffrey T Carley
(74) *Attorney, Agent, or Firm* — Muncy, Geissler, Olds & Lowe, PLLC

(57) ABSTRACT

A method for manufacturing a light set with surface mounted light emitting components is disclosed. A rod having a predetermined length and a winding control architecture with corresponding driving spindles are prepared first. The rod is driven to rotate by a winding machine via driving spindles to wind conducting wires. The insulating layer of each conducting wire is then ground along an axial direction of the rod to expose the conductor of each conducting wire to form contact-pad area. A conductive paste is applied to each contact-pad area, and the surface mounted light emitting components are straddled thereon. Each lead of the surface mounted light emitting components is respectively positioned corresponding to the contact-pad areas, and is electrically connected to the conductors by the conductive paste. The contact-pad areas and the surface mounted light emitting component are then covered with a package.

11 Claims, 9 Drawing Sheets

METHOD FOR MANUFACTURING LIGHT SET WITH SURFACE MOUNTED LIGHT EMITTING COMPONENTS

FIELD OF THE INVENTION

The present invention relates to the process design of a light set with semiconductor light emitting components, and more particularly, to a method for manufacturing a light set with surface mounted light emitting components.

BACKGROUND OF THE INVENTION

In recent years, semiconductor light emitting components have gradually replaced traditional lighting devices. The light emitting diode (LED) has a lot of advantages, such as small volume, quick response time, long service life, not easily attenuated, rigid outer casing, vibration-resistant, ability to emit different colors of light (including invisible light), allowing oriented-design, low voltage, low current, low conversion loss, low thermal radiation, easily mass-producible, environmental friendly, etc.

A conventional LED includes an LED dice encapsulated in a lamp-shaped package. A pair of leads is extended from the LED dice through the package for electrically connecting to external power sources. To use the LED, the pair of leads is respectively soldered to a positive conductor and a negative conductor, so that an electric current can be supplied to the LED dice via the leads for the LED to emit light. Since the lamp-shaped LED has a relatively large volume, a surface mounted LED having relatively small volume has been developed in response to the future trend of small-scale packaging and automated production of LEDs.

While the LED has a lot of advantages, it has the disadvantage of insufficient brightness due to its characteristics of low voltage and low current. Generally, to increase the brightness of the LED, a plurality of LEDs are combined or serially connected to form a light set or a light string for use.

SUMMARY OF THE INVENTION

As mentioned above, the leads of conventional semiconductor light emitting components are soldered to respectively connect to conducting wires. However, weld quality is difficult to control. The connection between a semiconductor light emitting component and a conducting wire is affected by the weld quality, and thus semiconductor light emitting components are prone to damage, separation, and other problems due to external impact, resulting in poor reliability.

In addition, when a plurality of semiconductor light emitting components are combined or serially connected, every pair of leads on a plurality of semiconductor light emitting components is soldered one by one onto conducting wires, resulting in a difficult repetitive manufacturing process. When a large number of semiconductor light emitting components are combined, the overall production rate is low. Also, accurate positioning of the semiconductor light emitting components on conducting wires is difficult, resulting in non-uniform spacing and poor quality of the product.

Therefore, the primary objective of the present invention is to provide a method for manufacturing a light set with surface mounted light emitting components, wherein the method makes fabrication quite easy to quickly and accurately manufacture a light set with surface mounted light emitting components, thereby overcoming the problems in production manufacturing of the conventional art.

To fulfill the above objects, the present invention provides a method for manufacturing a light set with surface mounted light emitting components. A rod having a predetermined length and a winding control architecture with corresponding driving spindles are prepared first. The rod is connected to the driving spindles, and then driven to rotate via the driving spindles by a winding machine. During rotation of the rod, at least two conducting wires with insulating layer coated and with a predetermined width between the two conducting wires are wound around a surface of the rod. The width corresponds to a selected lead pitch of the surface mounted light emitting components. The insulating layer of each conducting wire is then ground along an axial direction of the rod to expose the conductor of each conducting wire to form contact-pad areas. A conductive paste is applied to each contact-pad area, and the surface mounted light emitting components are straddled thereon. Each lead of the surface mounted light emitting components is respectively positioned corresponding to the contact-pad areas, and is electrically connected to the conductors by the conductive paste.

In a preferred embodiment of the present invention, the conducting wires are wound around the surface of the rod in a predetermined winding pitch. After the surface mounted light emitting components are straddled on contact-pad areas of the adjacent conducting wires, electrical conductivity tests are conducted to the surface mounted light emitting component and the conducting wires. Then, the contact-pad areas and the surface mounted light emitting component are then covered with a package and baked to cure the package. In an embodiment, the rod is cylindrical, and the surface of the rod is formed with two spiral grooves for the winding of the conducting wires. The conducting wires are enamel-insulated wires and the conductive paste used is silver paste. The surface mounted light emitting components are surface mounted light emitting diodes (LEDs).

The technique used by the present invention of grinding the conducting wires all together after being wound on a winding control architecture not only reduces manufacturing time and increases efficiency, but can also control the positions of the exposed conductors. By adjusting the winding pitch, it allows each surface mounted light emitting component to be equally spaced on the conducting wires of the end product to achieve accurate positioning.

Furthermore, there is no need for the leads of the surface mounted light emitting components to be soldered one by one. Instead, the leads are directly straddled on and between corresponding contact-pad areas, and are electrically connected to the conductors of the conducting wires by the conductive paste. Thus, the fabrication process is easy, convenient, and effectively increases the efficiency of production.

Moreover, the contact-pad areas provide positioning for the surface mounted light emitting components, allowing the contact area between the surface mounted light emitting components and the conducting wires to be larger. The surface is further covered by a package providing stability in the overall structure, making it less prone to damage and separation due to external impact, thereby improving reliability.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
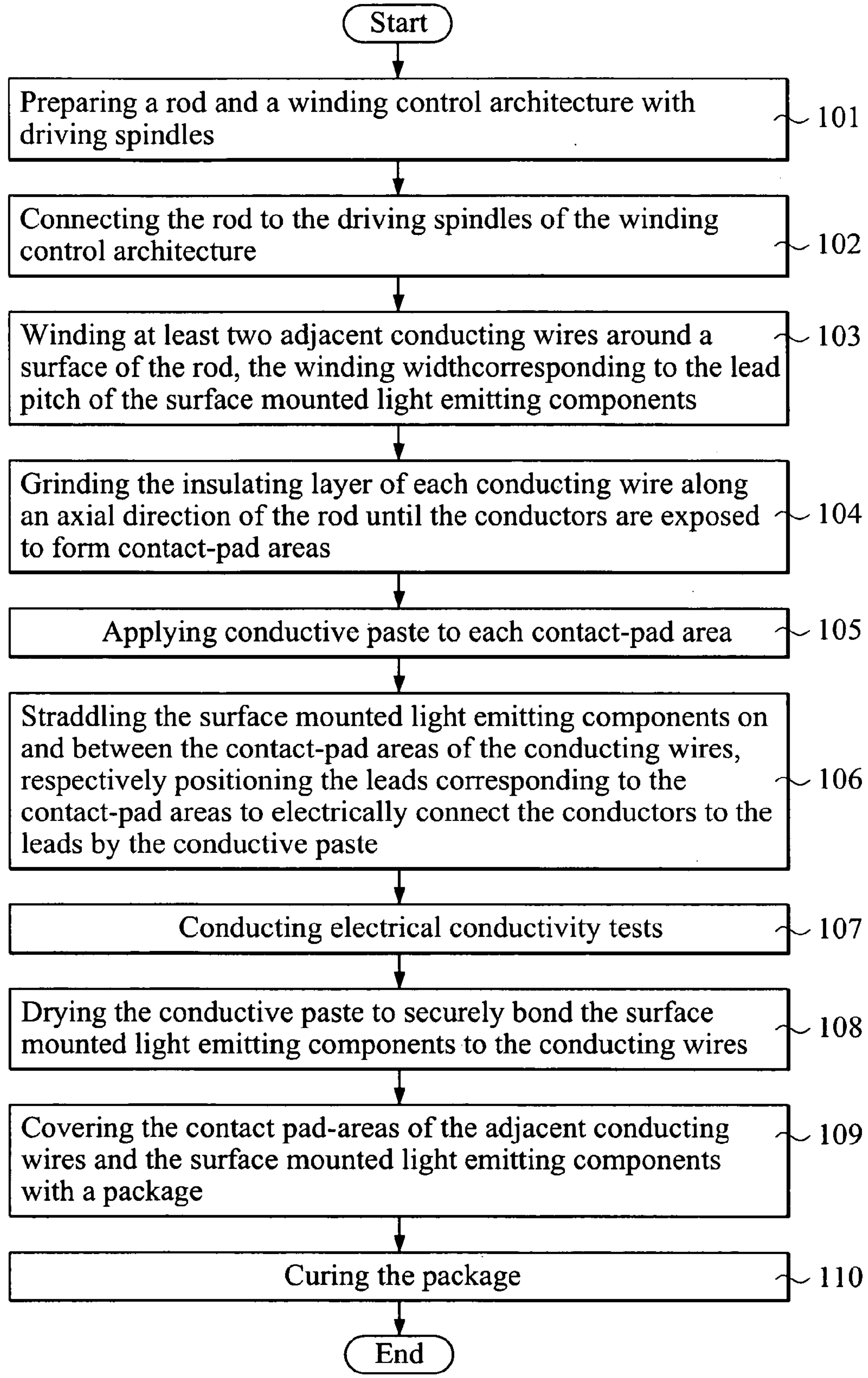
FIG. 1 is a flow chart showing the steps of a preferred embodiment of the present invention.

Please refer to FIG. 1 showing a flow chart of the steps of a preferred embodiment of the present invention. Reference is also made to FIG. 2 through FIG. 12 and detailed descriptions of the preferred embodiment of the present invention hereinafter.

Figure 2:
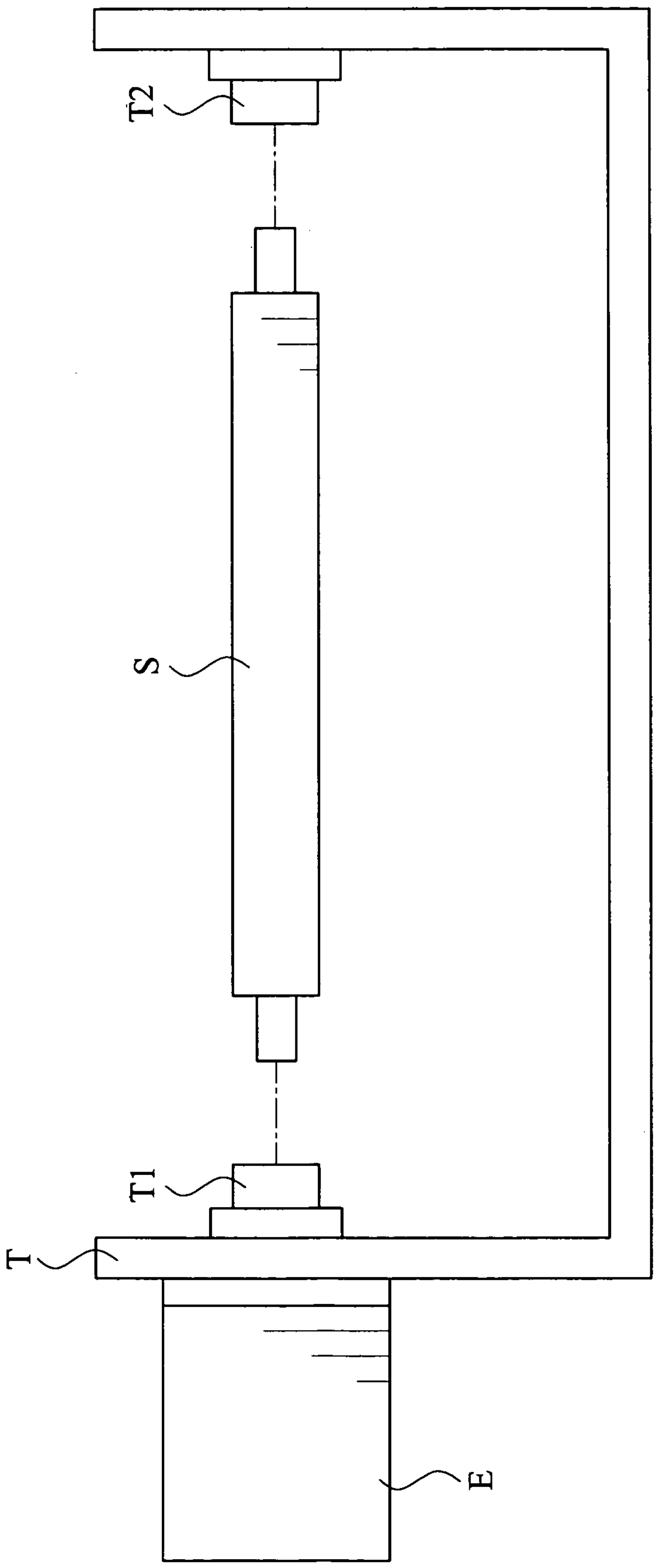
FIG. 2 is a schematic side view of a rod, a winding control architecture, and a winding machine.
Figure 3:
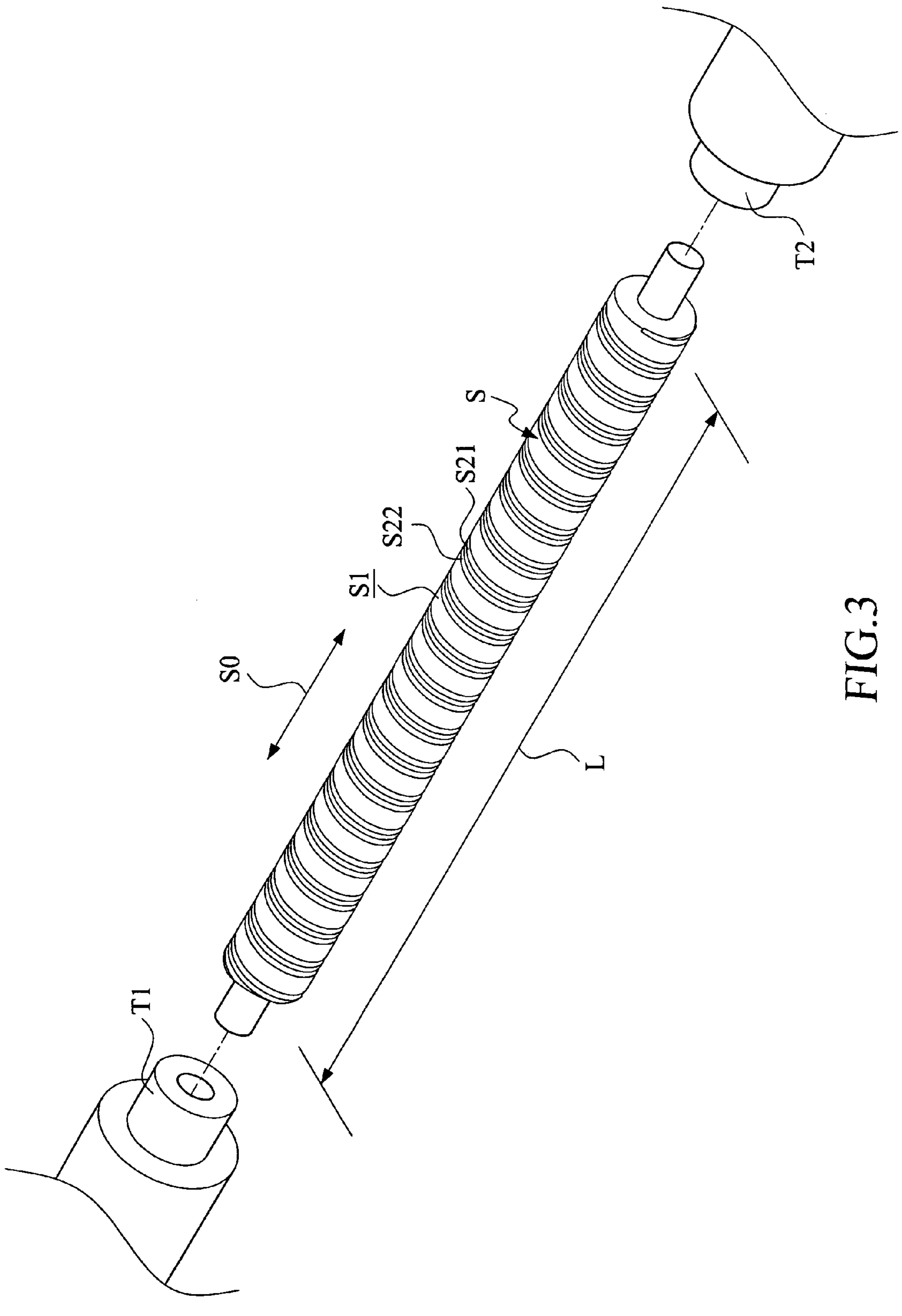
FIG. 3 is a perspective view showing the rod and the winding control architecture with corresponding driving spindles.
Figure 4:
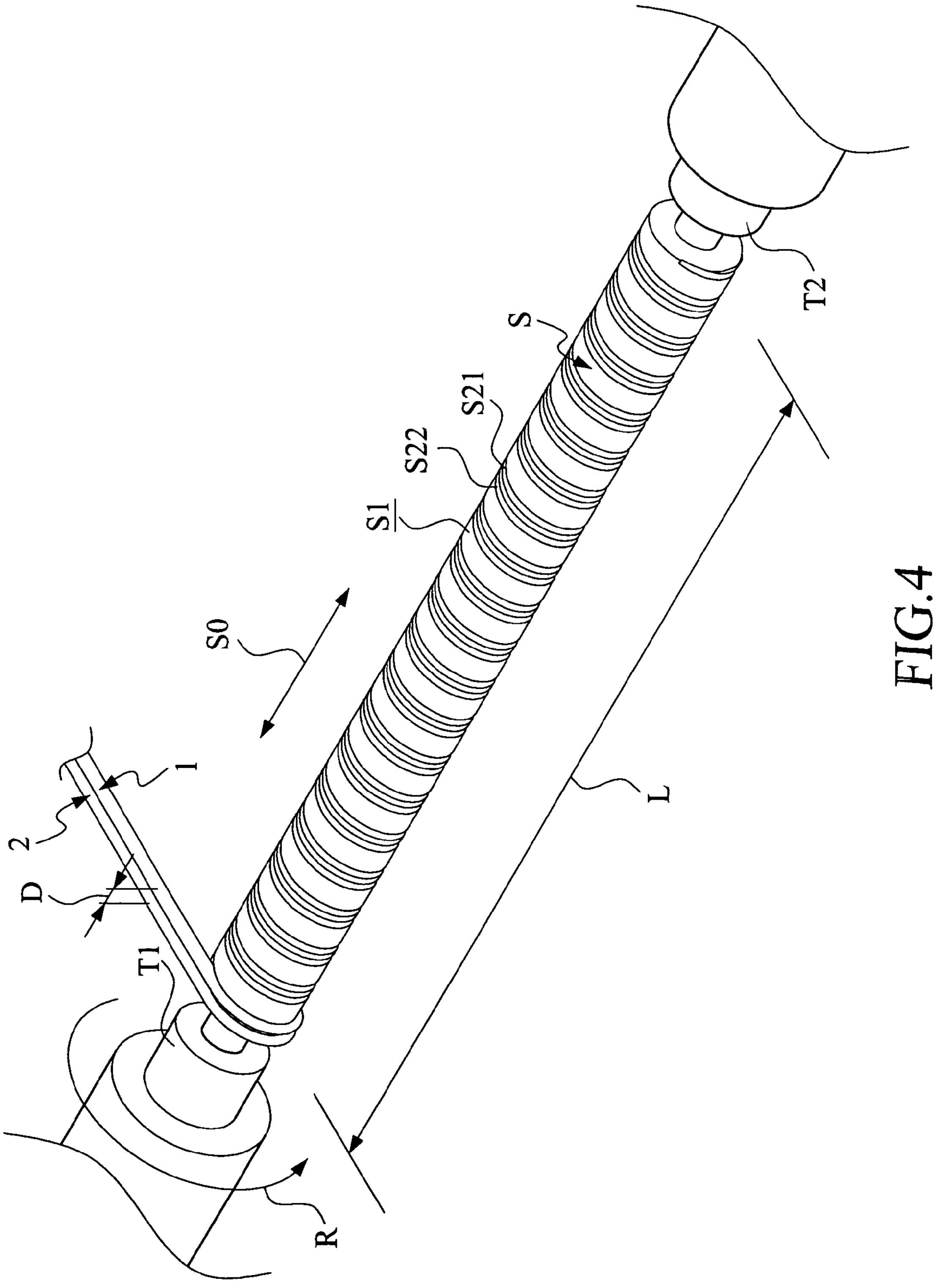
FIG. 4 is a perspective view showing that the rod is connected to the driving spindles of the winding control architecture.

Please refer to FIGS. 2, 3, and 4. A rod S having a predetermined length L and a winding control architecture T with corresponding driving spindles T1, T2 are prepared first (Step 101). Then, the rod S is connected to the driving spindles T1, T2 of the winding control architecture T, and the driving spindles T1, T2 are driven to rotate by a winding machine E (Step 102).

Figure 5:
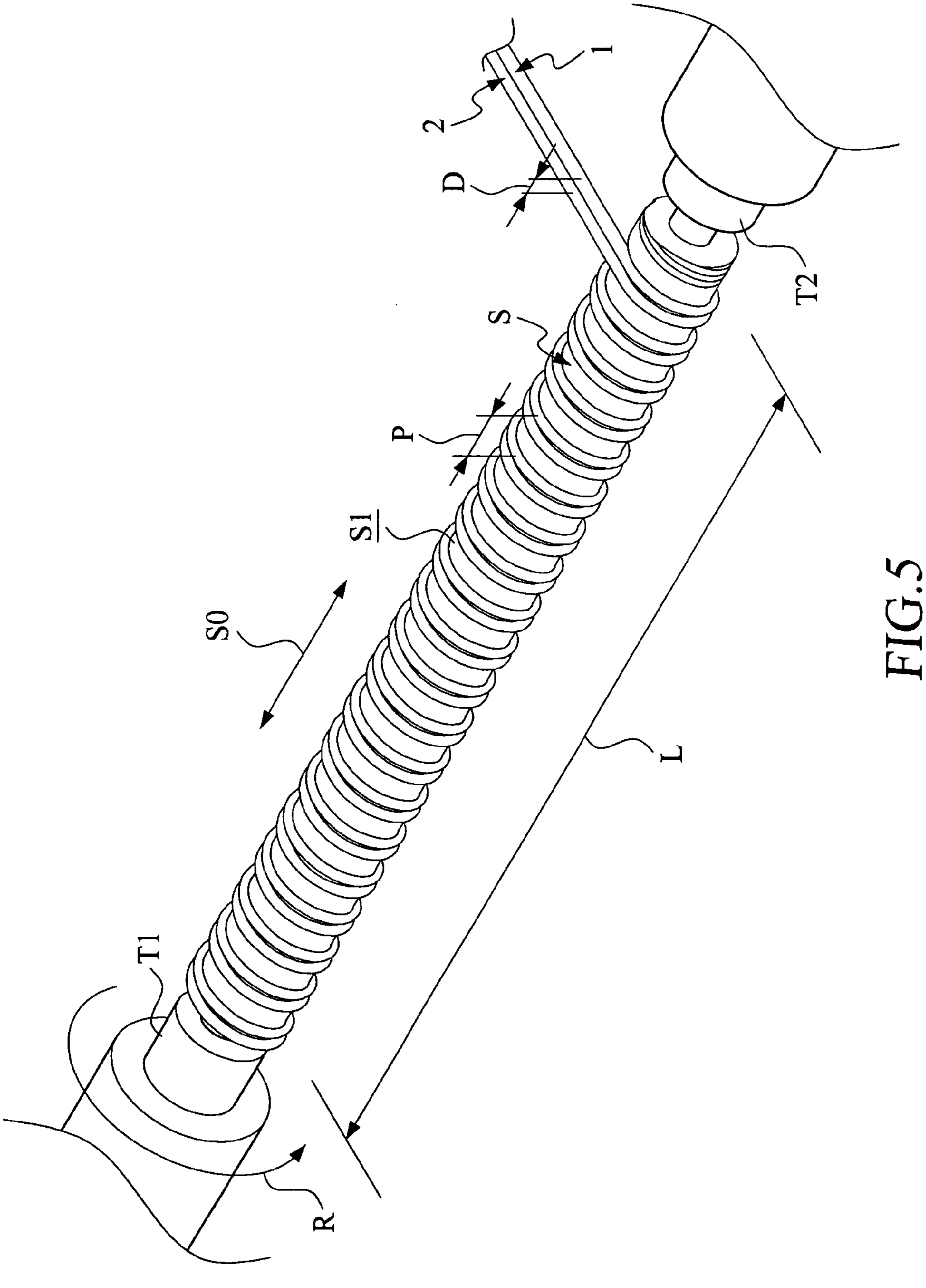
FIG. 5 is a perspective view showing conducting wires wound around the surface of the rod.

Please refer to FIG. 5. When the rod S is rotated by the driving spindles T1, T2 of the winding control architecture T along a rotation direction R, at least two conducting wires 1, 2 with insulating layers 11, 21 coated thereon and with a predetermined width -D between the two conducting wires 1, 2 are wound around a surface S1 of the rod S, wherein the width D corresponds to a selected lead pitch of surface mounted light emitting components (Step 103).

In the present embodiment, the shape of the rod S is cylindrical, but it may also be other shapes, such as elliptic. The rod S has an axial direction S0, and at least two spiral grooves S21, S22 are formed on the surface S1 of the rod S for the conducting wires 1, 2 to wind around in order to maintain an identical width D when the conducting wires 1, 2 are wound around the surface S1 of the rod S.

Figure 6:
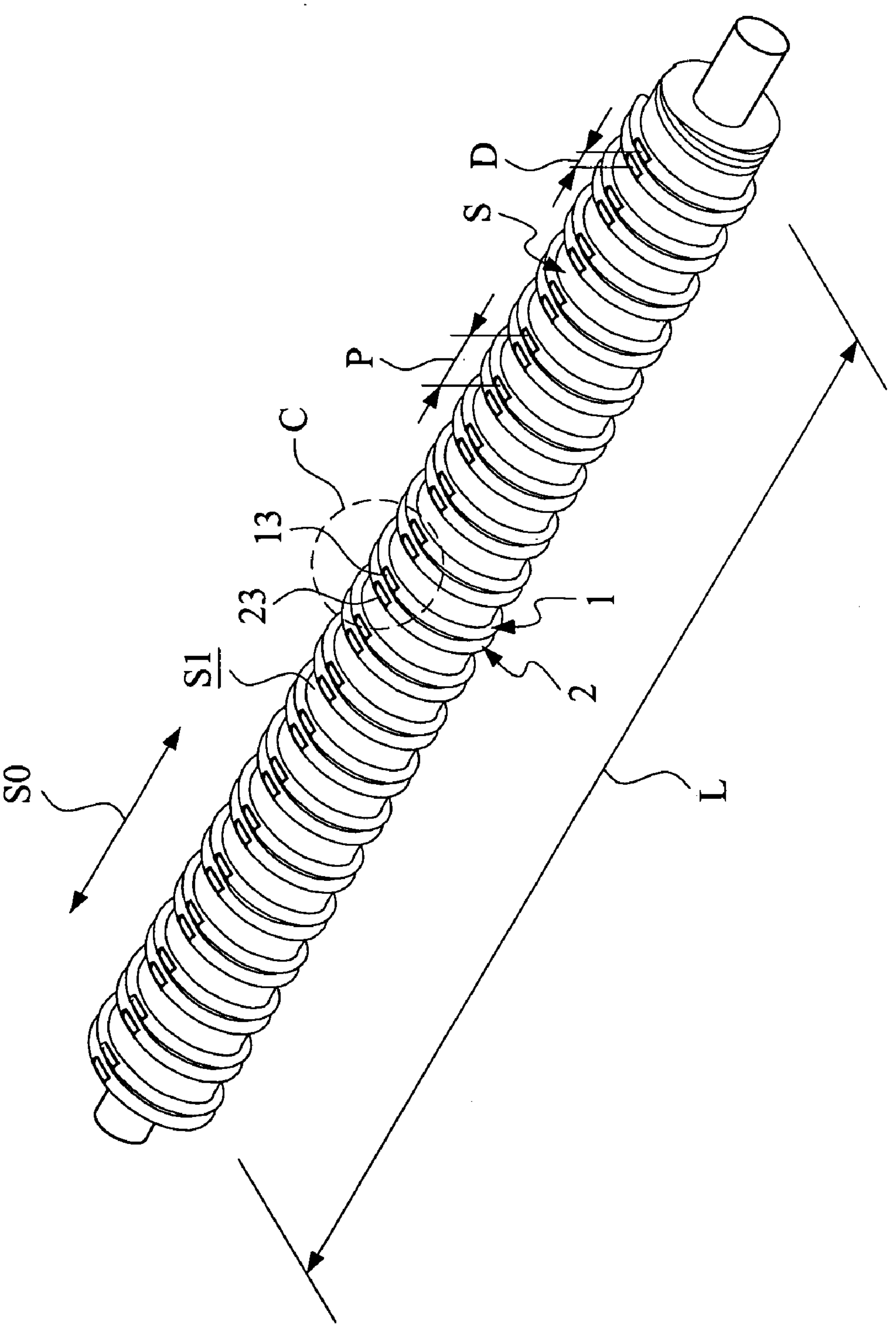
FIG. 6 is a perspective view of the conducting wires after being ground.
Figure 7:
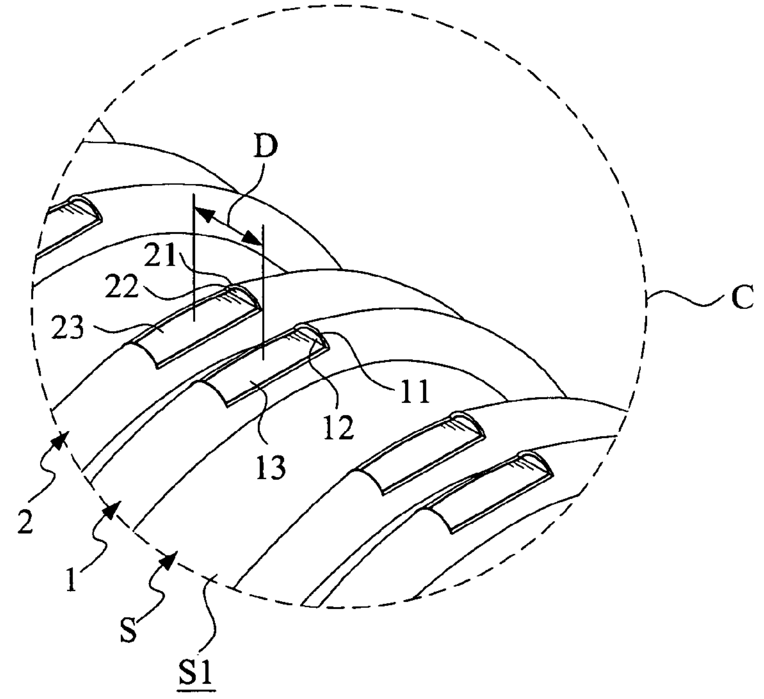
FIG. 7 is a partially enlarged view of area C in FIG. 6.

Please refer to FIGS. 6 and 7. After the conducting wires 1, 2 are wound around the rod S, the insulating layers 11, 21 of the conducting wires 1, 2 are ground along the axial direction S0 of the rod S until each conductor 12, 22 of the conducting wires 1, 2 is exposed to form contact-pad areas 13, 23 in corresponding positions on each conducting wire 1, 2 (Step 104).

In the present embodiment, the conducting wires 1, 2 are enamel-insulated wires and the conductors 12, 22 are copper conductors, and the insulating layers 11, 21 being an insulating enamel varnish coated on the outer side of the copper conductors. Of course, the conducting wires 1, 2 are not necessarily limited to enamel-insulated wires, but can be other types of wires, such as PVC electronic wires, PE wires, cables, etc., and can be multiple wires enclosed together as a power cord. The conducting wires 1, 2 are wound around the surface S1 of the rod S in a predetermined winding pitch P. The winding pitch P affects the distance between contact-pad areas on the same conducting wire. When the winding pitch P is fixed, the space between processed contact-pad areas is identical. The winding pitch P is the distance along the axial direction S0 for the conducting wires to wind around the rod S for one cycle in the present embodiment.

Figure 8:
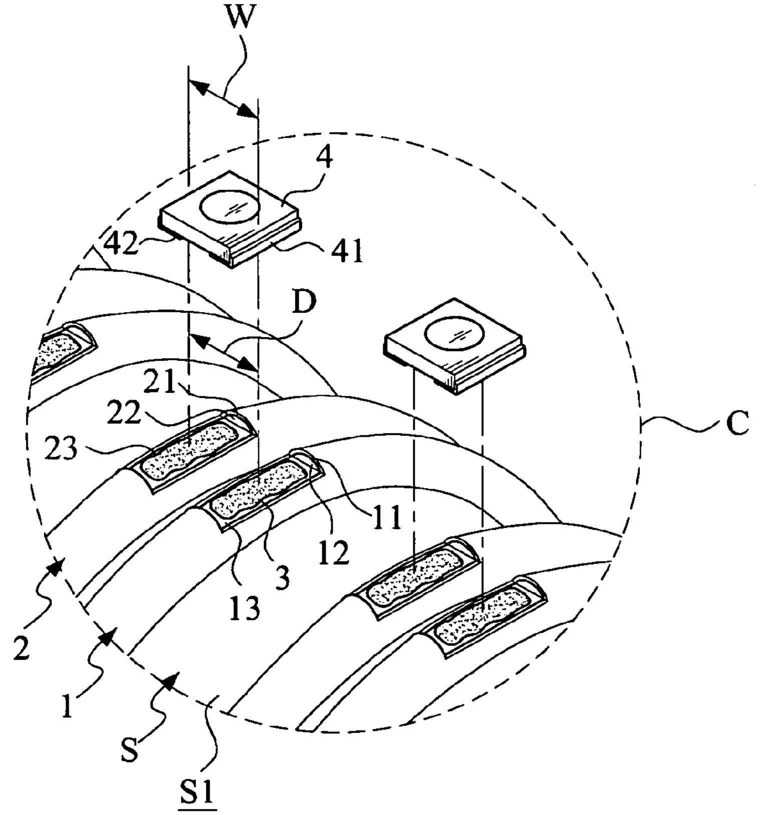
FIG. 8 is a partially enlarged view showing the leads of the surface mounted light emitting components corresponding to the contact-pad areas applied with conductive paste.
Figure 9:
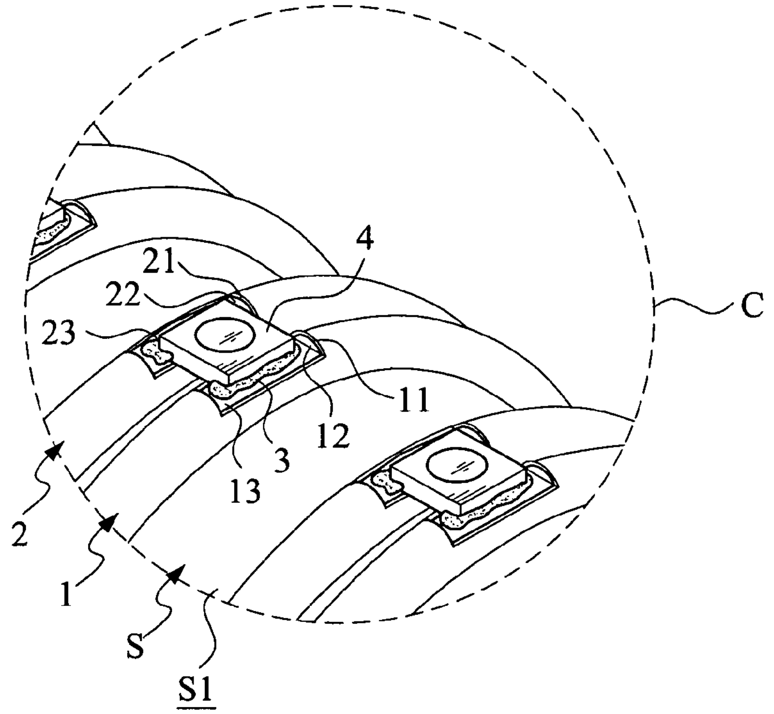
FIG. 9 is a partially enlarged view of the surface mounted light emitting components straddled on and between the conducting wires.

Please refer to FIGS. 8 and 9. After the contact-pad areas 13, 23 are formed on the conducting wires 1, 2, a conductive paste 3 is applied to each contact-pad area 13, 23 (Step 105). Then, a surface mounted light emitting component 4 is straddled on and between the contact-pad areas 13, 23 of the adjacent conducting wires 1, 2. Each lead 41, 42 of the surface mounted light emitting component 4 is respectively positioned corresponding to the contact-pad areas 13, 23 of the adjacent conducting wires 1, 2, and then electrically connected to the conductors 12, 22 of the adjacent conducting wires 1, 2 by the conductive paste 3 (Step 106). Electrical conductivity tests are conducted to the surface mounted light emitting component 4 and the conducting wires 1, 2 afterward (Step 107) to detect whether or not the surface mounted light emitting component 4 and the conducting wires 1, 2 are electrically connected.

In the present embodiment, the surface mounted light emitting component 4 is a surface mounted light emitting diode (LED) comprising a pair of leads 41, 42 having a predetermined lead pitch W, wherein the lead pitch W and the width D of the conducting wires 1, 2 are the same. During the electrical conductivity tests, the conducting wires 1, 2 are respectively connected to a positive and negative power source. The light emitted from the surface mounted light emitting component 4 is used to determine whether or not the surface mounted light emitting component 4 is electrically connected. Of course, there are various types of surface mounted light emitting components with different specifications. Some of the surface mounted light emitting components are designed to have three or more leads. In this case, the number of conducting wires must be adjusted to meet the number of leads, and the width of the conducting wires is adjusted corresponding to the lead pitch, thereby allowing leads to be respectively positioned corresponding to contact-pad areas when surface mounted light emitting components are straddled on and among conducting wires to become electrically connected.

The conductive paste 3 used in the present embodiment is silver paste. The conductive paste 3 has to be dried at a high temperature in an oven to allow the surface mounted light emitting component 4 to be securely bonded to the conducting wires 1, 2 (Step 108), thereby allowing the surface mounted light emitting component 4 and the conductors 12, 22 of the conducting wires 1, 2 to be in contact and electrically conductive by the conductive paste 3. The baking time is about 1.5 hours at 150° C. Not only does the conductive paste 3 facilitate conductivity, but also increases the strength of the bond between the surface mounted light emitting component 4 and the conducting wires 1, 2 to ensure stable and fixed straddling of the surface mounted light emitting component 4 on the contact-pad areas 13, 23 of the conducting wires 1, 2. Since there is no need to solder any leads, the overall fabrication process is easy, convenient, and without difficulties in production.

Figure 10:
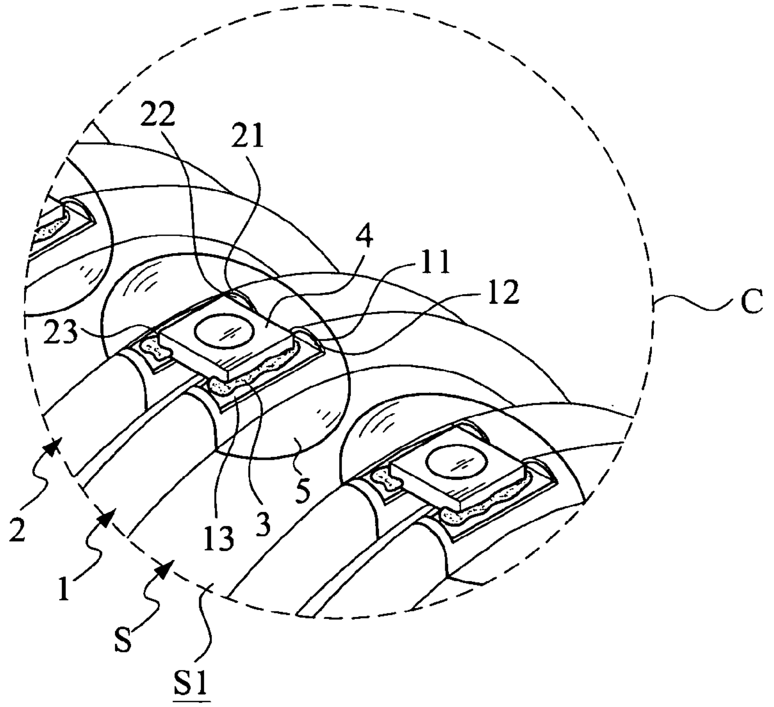
FIG. 10 is a partially enlarged view of the surface mounted light emitting components and the contact-pad areas covered with packages.
Figure 11:
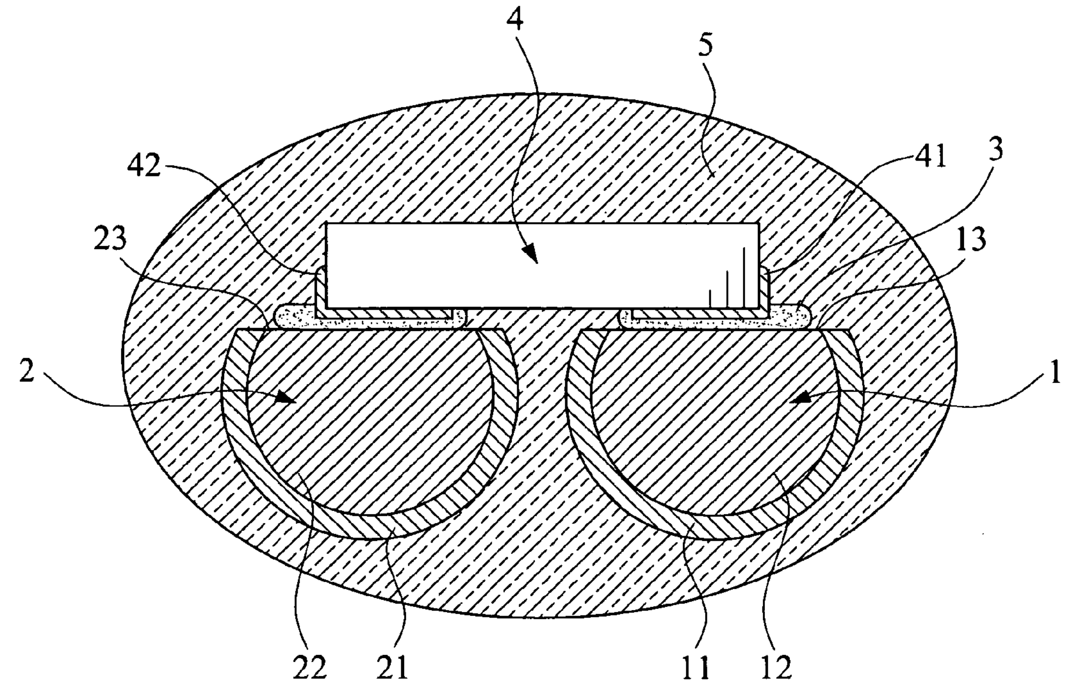
FIG. 11 is a cross sectional view of a surface mounted light emitting component and the contact-pad area covered with a package.

Please refer to FIGS. 10 and, 11. After the surface mounted light emitting component 4 is straddled, the contact-pad areas 13, 23 of the adjacent conducting wires 1, 2 and the surface mounted light emitting component 4 are covered with a package 5 (Step 109). An epoxy is used as the package 5. The conducting wires 1, 2 covered with the package 5 is then disposed in an oven to bake for 2 hours at 150° C. to cure the package 5 (Step 110). The package 5 protects the conducting wires 1, 2 of the surface mounted light emitting component 4 against damage and separation due to external impact and also improves the reliability of the overall structure. Furthermore, the electrical insulating effect of the package 5 is used to prevent the conducting wires 1, 2 from electrical contact with an external environment, and resuming the original insulating effect of the conducting wires 1, 2 to prevent failure due to contact with external dust or particles. In addition, the angle of divergence of the light emitted from the surface mounted light emitting component 4 can also be adjusted via the package 5 to meet a user's requirements.

Figure 12:
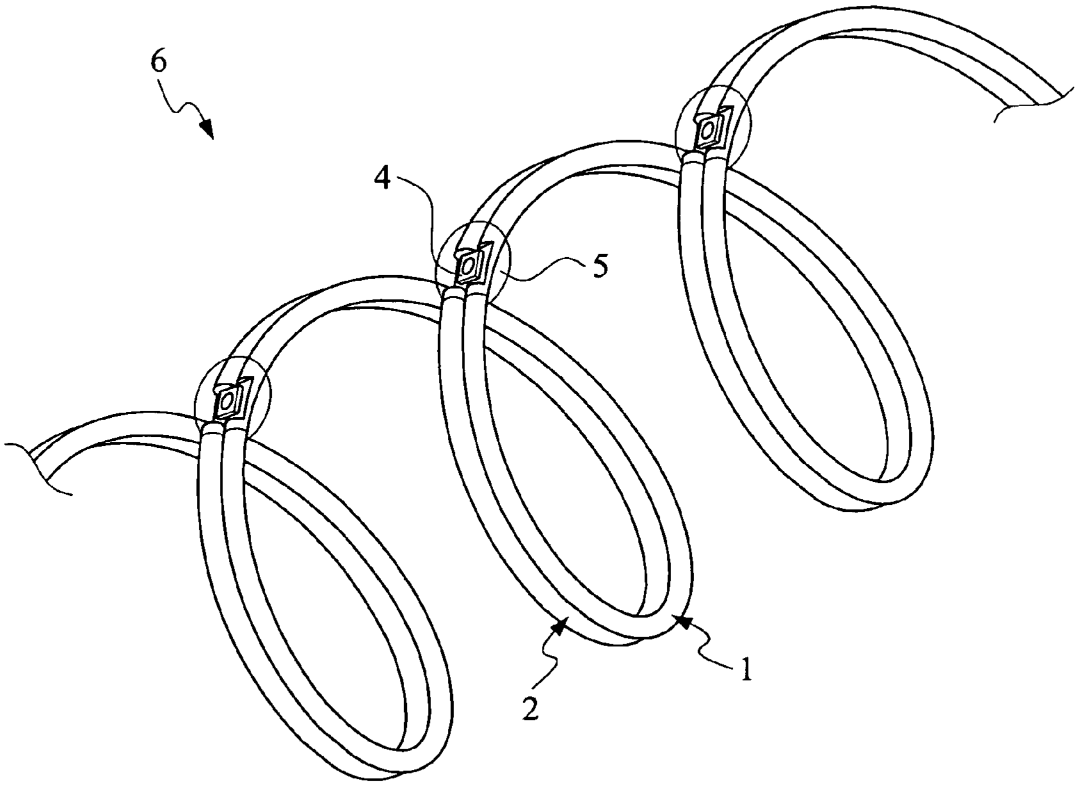
FIG. 12 is a perspective view of a light set with the surface mounted light emitting components.

Please refer to FIG. 12. Finally, the conducting wires 1, 2 are removed from the rod S to form the surface mounted light emitting component light set 6. In practical application, the conducting wires 1, 2 can be freely bent or coiled to wind around different articles, such as a Christmas tree, a door, a window, etc. to serve as a form of ornamentation.

Although the present invention has been described with reference to the preferred embodiments thereof, as well as the best mode for carrying out the present invention, it is apparent to those skilled in the art that a variety of modifications and changes may be made without departing from the scope of the present invention which is intended to be defined by the appended claims.

What is claimed is:

1. A method for manufacturing a light set with a plurality of surface mounted light emitting components, comprising:

(a) preparing a rod having a predetermined length and a winding control architecture with driving spindles;

(b) connecting the rod to the driving spindles of the winding control architecture, wherein the driving spindles are driven to rotate by a winding machine;

(c) winding at least two conducting wires, which are coated with an insulating layer and with a predetermined width between the two conducting wires, around a surface of the rod when the rod is rotated by the driving spindles of the winding control architecture, wherein the width corresponds to a selected lead pitch of the surface mounted light emitting components;

(d) grinding an insulating layer of each conducting wire along an axial direction of the rod until a conductor of each conducting wire is exposed to form contact-pad areas in corresponding positions on each conducting wire;

(e) applying a conductive paste to each contact-pad area; and (f) straddling the surface mounted light emitting components on and between the contact-pad areas of the conducting wires, wherein each lead of the surface mounted light emitting components is respectively positioned corresponding to the contact-pad areas of the adjacent conducting wires to be electrically connected to the conductors of the adjacent conducting wires by the conductive paste.

2. The method for manufacturing the light set as claimed in claim 1, wherein the conducting wires are further wound around the surface of the rod in a predetermined winding pitch in Step (c).

3. The method for manufacturing the light set as claimed in claim 1, further comprising a step to conduct electrical conductivity tests to the surface mounted light emitting components and the conducting wires after Step (f).

4. The method for manufacturing the light set as claimed in claim 1, further comprising a step to dry the conductive paste, allowing the surface mounted light emitting components to be securely bonded to the conducting wires after Step (f).

5. The method for manufacturing the light set as claimed in claim 1, further comprising a step to cover the contact-pad areas of the adjacent conducting wires and the surface mounted light emitting components with a package after Step (f).

6. The method for manufacturing the light set as claimed in claim 5, further comprising a step to cure the package after the step to cover the contact-pad areas of the adjacent conducting wires and the surface mounted light emitting components with the package.

7. The method for manufacturing the light set as claimed in claim 1, wherein the rod is cylindrical.

8. The method for manufacturing the light set as claimed in claim 1, wherein the surface of the rod further has at least two spiral grooves formed for the conducting wires to wind around.

9. The method for manufacturing the light set as claimed in claim 1, wherein the conducting wires are enamel-insulated wires.

10. The method for manufacturing the light set as claimed in claim 1, wherein the conductive paste is a silver paste.

11. The method for manufacturing the light set as claimed in claim 1, wherein the surface mounted light emitting components are surface mounted light emitting diodes (LEDs).

* * * * *